(12) United States Patent
Su et al.

(10) Patent No.: US 10,868,047 B2
(45) Date of Patent: Dec. 15, 2020

(54) ARRAY SUBSTRATE, DISPLAY PANEL AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiujie Su, Beijing (CN); Tao Luo, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/093,223

(22) PCT Filed: Feb. 27, 2018

(86) PCT No.: PCT/CN2018/077363
§ 371 (c)(1),
(2) Date: Oct. 12, 2018

(87) PCT Pub. No.: WO2018/177057
PCT Pub. Date: Oct. 4, 2018

(65) Prior Publication Data
US 2019/0172844 A1     Jun. 6, 2019

(30) Foreign Application Priority Data

Mar. 31, 2017  (CN) .......................... 2017 1 0210006

(51) Int. Cl.
*H01L 27/12*     (2006.01)
*H01L 27/32*     (2006.01)
(Continued)

(52) U.S. Cl.
CPC .......... *H01L 27/124* (2013.01); *G02F 1/1362* (2013.01); *G02F 1/1368* (2013.01); *H01L 27/3262* (2013.01); *H01L 29/41733* (2013.01)

(58) Field of Classification Search
CPC . H01L 27/124; G02F 1/1368; G02F 1/13624; G02F 1/136286; G02F 1/134309; G02F 1/1343; G02F 2001/134345
See application file for complete search history.

(56) References Cited

U.S. PATENT DOCUMENTS 9,859,445 B2    1/2018  Ma
2004/0125250 A1  7/2004  Park
(Continued)

FOREIGN PATENT DOCUMENTS

CN    1584718 A      2/2005
CN    103412449 A    11/2013
(Continued)

OTHER PUBLICATIONS

Translation of KR1020090073687A (Original in Korean was submitted as part of the IDS dated Mar. 28, 2019) (Year: 2009).*
(Continued)

*Primary Examiner* — Eric A. Ward
*Assistant Examiner* — Eric K Ashbahian
(74) *Attorney, Agent, or Firm* — Leason Ellis LLP

(57) ABSTRACT

An array substrate, a display panel and a display device are disclosed. The array substrate includes a base substrate and a plurality of pixel unit. Each of the pixel unit includes a thin-film-transistor, and the thin-film-transistor includes a gate electrode and a drain electrode; the drain electrode includes a first drain electrode portion, a second drain electrode portion and a first connection portion; and an orthographic projection of the first drain electrode portion on the base substrate and an orthographic projection of the gate
(Continued)

electrode on the base substrate are spaced apart, and an orthographic projection of the second drain electrode portion on the base substrate and the orthographic projection of the gate electrode on the base substrate at least partially overlap.

18 Claims, 10 Drawing Sheets

(51) Int. Cl.
    *G02F 1/1368*     (2006.01)
    *H01L 29/417*     (2006.01)
    *G02F 1/1362*     (2006.01)

(56) References Cited

U.S. PATENT DOCUMENTS

| | | | |
|---|---|---|---|
| 2005/0041169 A1 | 2/2005 | Hashimoto et al. | |
| 2005/0286003 A1* | 12/2005 | Lee | G02F 1/134363 349/141 |
| 2008/0088783 A1* | 4/2008 | Tai | G02F 1/136213 349/129 |
| 2011/0156046 A1* | 6/2011 | Kim | G03F 1/14 257/72 |
| 2012/0133855 A1* | 5/2012 | Whangbo | G02F 1/1343 349/41 |
| 2014/0054702 A1* | 2/2014 | Choi | H01L 29/41733 257/347 |
| 2015/0092134 A1* | 4/2015 | Jiang | G02F 1/136286 349/46 |
| 2015/0129882 A1 | 5/2015 | Jiang et al. | |

FOREIGN PATENT DOCUMENTS

| | | |
|---|---|---|
| CN | 103472647 A | 12/2013 |
| CN | 105137679 A | 12/2015 |
| CN | 106950771 A | 7/2017 |
| KR | 20080004005 A | 1/2008 |
| KR | 20090073687 A | 7/2009 |

OTHER PUBLICATIONS

International Search Report and Written Opinion in corresponding PCT Application No. PCT/CN2018/077363, dated May 30, 2018 (an English translation attached hereto).

Chinese Office Action in corresponding Chinese Application No. 201710210006.5 dated May 10, 2019 (an English translation attached hereto). 15 pages.

Chinese Office Action in corresponding Chinese Application No. 201710210006.5 dated Aug. 5, 2019 (an English translation attached hereto). 14 pages.

\* cited by examiner

ARRAY SUBSTRATE, DISPLAY PANEL AND DISPLAY DEVICE

CROSS-REFERENCE TO RELATED PATENT APPLICATIONS

The application is a U.S. National Stage Application under 35 U.S.C. § 371 of International Patent Application No. PCT/CN2018/077363, filed Feb. 27, 2018, which claims priority to Chinese patent application No. 201710210006.5, filed on Mar. 31, 2017, the entire disclosures of which are incorporated herein by reference in their entireties as part of the present application.

TECHNICAL FIELD

Embodiments of present disclosure relates to an array substrate, a display panel and a display device.

BACKGROUND

In the field of display technology, a thin-film-transistor (TFT) is an important device to a display device. The thin-film-transistor plays an important role in the display quality of the display device. U shaped TFTs are widely applied because of its large operation current.

SUMMARY

At least one embodiment of present disclosure provides an array substrate, and the array substrate includes a base substrate and a plurality of pixel units, which are arranged in an array and provided on the base substrate. Each of the pixel units includes a thin-film-transistor, and the thin-film-transistor includes a gate electrode and a drain electrode; the drain electrode includes a first drain electrode portion, a second drain electrode portion and a first connection portion; an extension line of the second drain electrode portion intersects with the first drain electrode portion, and the first connection portion connects the second drain electrode portion and the first drain electrode portion; and an orthographic projection of the first drain electrode portion on the base substrate and an orthographic projection of the gate electrode on the base substrate are spaced apart, and an orthographic projection of the second drain electrode portion on the base substrate and the orthographic projection of the gate electrode on the base substrate at least partially overlap.

For example, in the array substrate provided by at least one embodiment of present disclosure, a surface, which is away from the base substrate, of the first drain electrode portion is closer to the base substrate in a direction perpendicular to the base substrate compared with a surface, which is away from the base substrate, of the second drain electrode portion.

For example, in the array substrate provided by at least one embodiment of present disclosure, the drain electrode includes one first drain electrode portion, two second drain electrode portions and the first connection portion; the first connection portion connects the two second drain electrode portions respectively with two ends of the first drain electrode portion; and an orthographic projection of a structure, formed of the first drain electrode portion, the two second drain electrode portions and the first connection portion, on the base substrate is U-shaped.

For example, in the array substrate provided by at least one embodiment of present disclosure, the each of the pixel units includes two sub-pixels sequentially provided along a first direction and two thin-film-transistors provided between the two sub-pixels; and the two thin-film-transistors in the each of the pixel units share the first drain electrode portion.

For example, the array substrate provided by at least one embodiment of present disclosure further includes a data line extending along the first direction. The drain electrode further includes a second connection portion connecting the first drain electrode portion and the data line; and the two thin-film-transistors in the each of the pixel units share the second connection portion.

For example, the array substrate provided by at least one embodiment of present disclosure further includes a gate line. The gate line extends along a direction intersects with the first direction; and two gate lines are provided between the two sub-pixels in the each of the pixel units.

For example, in the array substrate provided by at least one embodiment of present disclosure, at least a part of each of the gate lines is used as a gate electrode of a corresponding thin-film-transistor.

For example, in the array substrate provided by at least one embodiment of present disclosure, each of the thin-film-transistors further includes a source electrode which is arranged to be spaced apart from the drain electrode; the source electrode includes a first source electrode portion provided between the two second drain electrode portions of the thin-film-transistor; and a distance between an orthographic projection of the first source electrode portion on the base substrate and the orthographic projection of the first drain electrode portion on the base substrate along the first direction is no less than a distance between the orthographic projection of the gate electrode on the base substrate and the orthographic projection of the first drain electrode portion on the base substrate along the first direction.

For example, in the array substrate provided by at least one embodiment of present disclosure, the distance between the orthographic projection of the first source electrode portion on the base substrate and the orthographic projection of the first drain electrode portion on the base substrate along the first direction is equal to the distance between the orthographic projection of the gate electrode on the base substrate and the orthographic projection of the first drain electrode portion on the base substrate along the first direction.

For example, in the array substrate provided by at least one embodiment of present disclosure, the each of the pixel units further includes a pixel electrode; the source electrode further includes a second source electrode portion and a third source electrode portion; the second source electrode portion connects the first source electrode portion and the third source electrode portion; the third source electrode portion and the pixel electrode connect with each other electrically; and a width of the second source electrode portion along a second direction, which is perpendicular to the first direction, is larger than a width of the first source electrode portion along the second direction, and the width of the second source electrode portion along the second direction is smaller than a width of the third source electrode portion along the second direction.

For example, in the array substrate provided by at least one embodiment of present disclosure, the distance between the orthographic projection of the first source electrode portion on the base substrate and the orthographic projection of the first drain electrode portion on the base substrate along the first direction is larger than a distance between the orthographic projection of the first source electrode portion on the base substrate and the orthographic projection of the second drain electrode portion on the base substrate along a second direction, which is perpendicular to the first direction.

For example, in the array substrate provided by at least one embodiment of present disclosure, the distance between the orthographic projection of the first source electrode portion on the base substrate and the orthographic projection of the first drain electrode portion on the base substrate along the first direction is 1.1-1.25 times of the distance between the orthographic projection of the first source electrode portion on the base substrate and the orthographic projection of the second drain electrode portion on the base substrate along the second direction, which is perpendicular to the first direction.

For example, in the array substrate provided by at least one embodiment of present disclosure, the distance between the orthographic projection of the first source electrode portion on the base substrate and the orthographic projection of the first drain electrode portion on the base substrate along the first direction is equal to 2.2 microns-2.5 microns.

For example, in the array substrate provided by at least one embodiment of present disclosure, an extension direction of each of the second drain electrode portions is parallel to an extension direction of the first source electrode portion; and an extension direction of each of the first drain electrode portions is perpendicular to the extension direction of the first source electrode portion.

For example, the array substrate provided by at least one embodiment of present disclosure further includes a data line and a gate line, which intersect with each other. The gate line includes a first overlapping portion and a first non-overlapping portion, wherein the first overlapping portion and the data line overlap with each other in a direction perpendicular to the base substrate, and the first non-overlapping portion and the data line do not overlap in the direction perpendicular to the base substrate; the data line includes a second overlapping portion and a second non-overlapping portion, wherein the second overlapping portion and the gate line overlap with each other in the direction perpendicular to the base substrate, and the second non-overlapping portion and the gate line do not overlap in the direction perpendicular to the base substrate; in a case where the gate line is provided at a side, which is closer to the base substrate, of the data line, a width of the second overlapping portion in a direction perpendicular to an extension direction of the data line is larger than a width of the second non-overlapping portion in the direction perpendicular to the extension direction of the data line; and in a case where the data line is provided at a side, which is closer to the base substrate, of the gate line, a width of the first overlapping portion in a direction perpendicular to an extension direction of the gate line is larger than a width of the first non-overlapping portion in the direction perpendicular to the extension direction of the gate line.

For example, in the array substrate provided by at least one embodiment of present disclosure, in the case where the gate line is provided at the side, which is closer to the base substrate, of the data line, a difference between the width of the second overlapping portion in the direction perpendicular to the extension direction of the data line and the width of the second non-overlapping portion in the direction perpendicular to the extension direction of the data line is in a range of 0.5 microns-1 micron; and in the case where the data line is provided at the side, which is closer to the base substrate, of the gate line, a difference between the width of the first overlapping portion in the direction perpendicular to the extension direction of the gate line and the width of the first non-overlapping portion in the direction perpendicular to the extension direction of the gate line is in a range of 0.5 microns-1 micron.

At least one embodiment of present disclosure further provides a display panel, and the display panel includes the array substrate provided by any one of the embodiments of the present disclosure.

For example, the display panel provided by at least one embodiment of present disclosure is a liquid crystal display panel, or an OLED display panel.

At least one embodiment of present disclosure further provides a display device, and the display device includes the array substrate provided by any one of the embodiments of the present disclosure, or the display panel provided by any one of the embodiments of the present disclosure.

At least one embodiment of present disclosure provides another array substrate. The array substrate includes a base, and a gate line, a data line, and a thin-film-transistor, which are provided on the base. A drain electrode of the thin-film-transistor electrically connects with the data line; the drain electrode includes a U-shape portion; a bottom of the U-shape portion does not overlap with the gate line and a gate electrode of the thin-film-transistor; a distance between a source electrode of the thin-film-transistor and the bottom of the U-shape portion is in the range of 2.2-2.5 μm.

For example, in another array substrate provided by at least one embodiment of present disclosure, a region, between the source electrode and the bottom of the U-shape portion, does not overlap with the gate line and the gate electrode.

For example, in another array substrate provided by at least one embodiment of present disclosure, a gate line in n-th row is provided to be adjacent to a gate line in (n−1)th row; for a thin-film-transistor in any column; a U-shape portion of a thin-film-transistor in the n-th row and a U-shape portion of a thin-film-transistor in the (n−1)th row share same one bottom; a part of the bottom shared is provided between the gate line in the n-th row and the gate line in the (n−1)th row; and n is a positive even number.

For example, in another array substrate provided by at least one embodiment of present disclosure, a portion of the gate line serves as the gate electrode.

For example, in another array substrate provided by at least one embodiment of present disclosure, the source electrode includes a first source electrode portion, a second source electrode portion, and a third source electrode portion, which sequentially connect with each other; the first source electrode portion is adjacent to an inner surface of the U-shape portion, a width of the second source electrode portion is larger than a width of the first source electrode portion, and the width of the second source electrode portion is smaller than a width of the third source electrode portion.

For example, in another array substrate provided by at least one embodiment of present disclosure, when the gate line is provided at a side, which is closer to the base, of the data line, a width of the gate line is equal to X; a width of a portion, which does not overlap with an orthographic projection of the gate line on the base, of the data line is equal to Y; and a width of a portion, which overlaps with the orthographic projection of the gate line on the base, of the data line is in a range of (Y+0.5)-(Y+1) μm.

For example, in another array substrate provided by at least one embodiment of present disclosure, when the data line is provided at a side, which is closer to the base, of the gate line, the width of the data line is equal to Y; a width of a portion, which does not overlap with an orthographic projection of the data line on the base, of the gate line is equal to X; and a width of a portion, which overlaps with the orthographic projection of the data line on the base, of the gate line is in a range of (X+0.5)-(X+1) μm.

At least one embodiment of present disclosure further provides another display panel, and the display panel includes another array substrate provided by at least one embodiment of present disclosure.

For example, in the display panel provided by at least one embodiment of present disclosure, the display panel is a liquid crystal display panel; or the display panel is an OLED display panel.

At least one embodiment of present disclosure further provides another display device, and the display device includes another array substrate provided by at least one embodiment of present disclosure.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventors of the present disclosure note that, for the array substrate including current U-shaped thin-film-transistors (TFTs), issues such as the large power consumption, small aperture ratio and/or high reject ratio (for example, the defect caused by electrical connection between the source electrode and the drain electrode) exist. The above-mentioned issues will be described in the following with reference to FIG. 1A, FIG. 1B and FIG. 2.

Figure 1A:
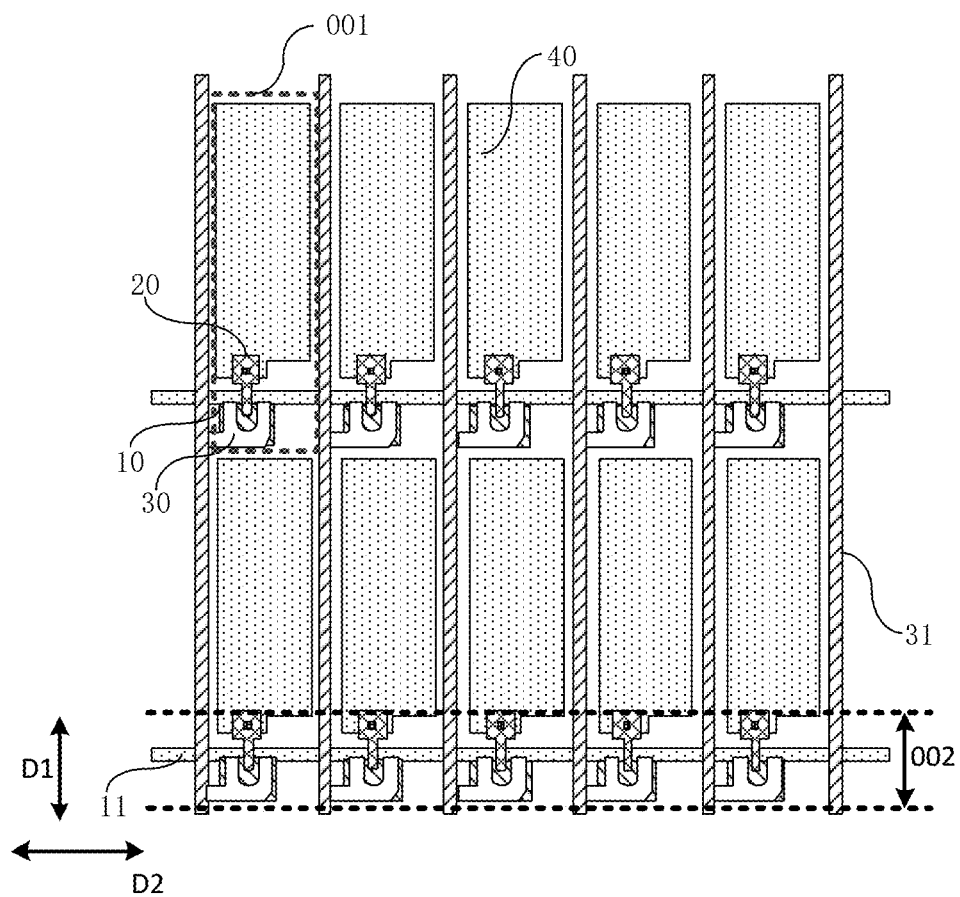
FIG. 1A is a plan view of an array substrate.

For example, FIG. 1A illustrates a plan view of an array substrate. As illustrated in FIG. 1A, the array substrate includes pixel units 001 which are arranged in an array, a gate line 11 provided between the pixel units 001 which are adjacent in a first direction D1, and a data line 31 provided between the pixel units 001 which are adjacent in a second direction D2. For example, as illustrated in FIG. 1A, each of the pixel units 001 includes a thin-film-transistor (TFT), and the thin-film-transistor includes a gate electrode 10, a source electrode 20 and a drain electrode 30. For example, the region in which the gate line 11, the gate electrode 10, the source electrode 20 and the drain electrode 30 are provided is the shielding region 002 of the array substrate. The shielding region 002 corresponds to the region, in which a black matrix is provided, of the opposite substrate. The inventors of the present disclosure note that, the size, of the shielding region 002 of the array substrate as illustrated in FIG. 1, in the extension direction (i.e., the first direction D1) of the data line is relatively large, and therefore, the aperture ratio of the array substrate as illustrated in FIG. 1A is relatively small.

Figure 1B:
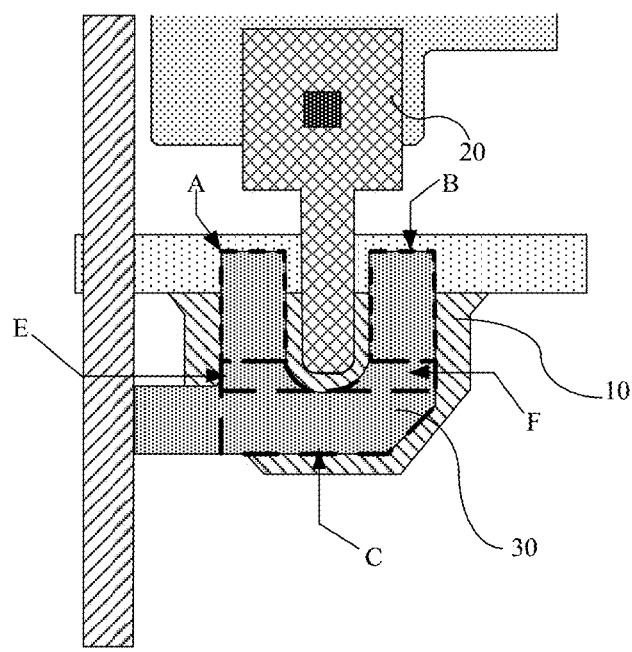
FIG. 1B is a plan view of a pixel unit of an array substrate.
Figure 2:
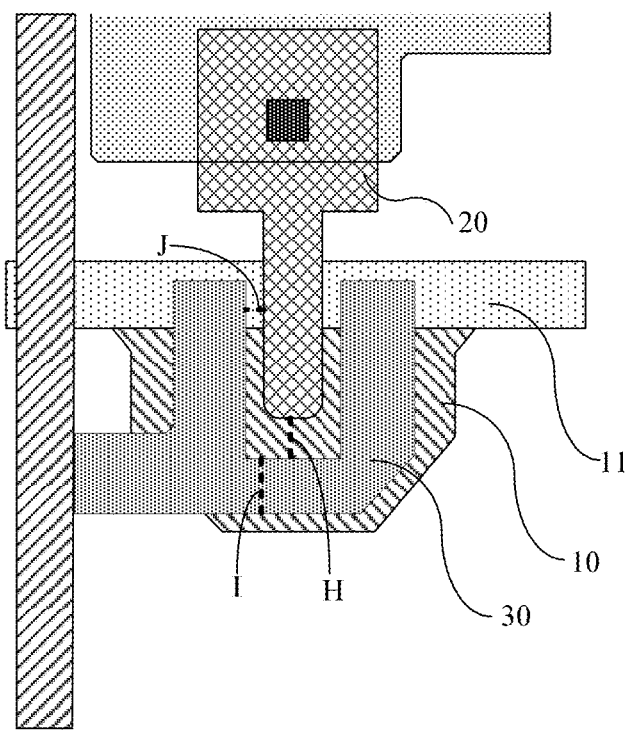
FIG. 2 is a plan view of another array substrate.

For example, FIG. 1B illustrates a U-shape TFT manufactured by the single slit mask (SSM) technology. For example, as illustrated in FIG. 1B, the drain electrode of the TFT includes a U-shape portion. For example, the distance between the source electrode 20 and the U-shape portion is uniform. The distance between the source electrode 20 and the U-shape portion is equal to 2 μm, but the embodiments of the present disclosure are not limited to this case. The U-shape portion includes a first drain electrode portion (the region C as illustrated in FIG. 1B), a second drain electrode portion (the regions A and B as illustrated in FIG. 1B) and a first connection portion (the regions E and F as illustrated in FIG. 1B). For example, the distance (refer to H as illustrated in FIG. 2) between the end, which is closer to the first drain electrode portion, of the source electrode 20 and the first drain electrode portion along the first direction D1 is equal to the distance between (refer to J as illustrated in FIG. 2) the side edge, which is closer to the second drain electrode portion, of the source electrode 20 and the second drain electrode portion along the second direction D2; the distance between the end, which is closer to the first drain electrode portion, of the source electrode 20 and the first drain electrode portion along the first direction D1 is, for example, equal to 1 micron-3 microns (for example, 2 microns). Because the structure formed by the second drain electrode portion and the first connection portion is in a curved shape, the process parameters in the manufacturing process are difficult to manage (for example, the sizes, along the first direction D1, of the formed regions E and F are smaller than a pre-determined size, and the size, along the first direction, of the formed region C is larger than a pre-determined size), and therefore, the first drain electrode portion is possible to electrically connect with the source electrode 20, and adverse effect to the performance of the TFT can be caused.

Furthermore, the inventors of the present disclosure further note that, the overlapping area between the first drain electrode portion and the gate electrode 10 (and/or the gate line 11) as illustrated in FIG. 1B is large, and therefore, the overlapping area between the drain electrode 30 and the gate electrode 10 (and/or the gate line 11) is relatively large, and the parasitic capacitance between the drain electrode 30 and the gate electrode 10 (and/or the gate line 11) is relatively large, and thus the load and the power consumption in the circuit are increased.

The inventors of the present disclosure further note that, the defect of the U-shape TFT can be alleviated by adopting the multi-slit mask (MSM) technology. However, compared with the SSM technology, adopting of the MSM technology can further increase the power consumption and decrease the aperture ratio. Illustrative descriptions will be given in the following with reference to FIG. 2.

For example, as illustrated in FIG. 2, the MSM technology can increase the distance H between the end, which is closer to the first drain electrode portion, of the source electrode 20 and the first drain electrode portion along the first direction D1 while the width I of the first drain electrode portion along the first direction, and the distance J between the source electrode 20 and the second drain electrode portion along the second direction D2 remain unchanged. The inventors of the present disclosure note that, even though the MSM technology can reduce the possibility of the electrical connection between the source electrode 20 and the first drain electrode portion, but increasing of the distance H between the first drain electrode portion and the source electrode 20 while the width I of the first drain electrode portion along the first direction remains unchanged can cause the area of the drain electrode 30 to be increased, and therefore, the overlapping area between the drain electrode 30 and the gate electrode 10 (and/or the gate line 11) is increased accordingly, and the parasitic capacitance between the drain electrode 30 and the gate electrode 10 (and/or the gate line 11) is increased, that is, the load of the circuit is increased. Because the charge-discharge performance of the pixel is decreased along with an increase of the load of the circuit, the power consumption is decreased.

Furthermore, increasing of the area of the drain electrode 30 can also cause the region, which needs to be shielded by the black matrix, of the array substrate to be increased (i.e., cause the width, along the first direction D1, of the shielding region 002 of the array substrate as illustrated in FIG. 1A to be increased), and therefore, the aperture ratio of the display device including the U-shape TFT is further decreased.

Embodiments of the present disclosure provide an array substrate, a display panel and a display device, and the array substrate, the display panel and the display device can reduce the power consumption.

At least one embodiment of present disclosure provides an array substrate, and the array substrate includes a base substrate, and a plurality of pixel units, which are arranged in an array and provided on the base substrate. Each of the pixel units includes a thin-film-transistor, and the thin-film-transistor includes a gate electrode and a drain electrode; the drain electrode includes a first drain electrode portion, a second drain electrode portion and a first connection portion; an extension line of the second drain electrode portion intersects with the first drain electrode portion, and the first connection portion is used to connect the second drain electrode portion and the first drain electrode portion; and an orthographic projection of the first drain electrode portion on the base substrate and an orthographic projection of the gate electrode on the base substrate are spaced apart, and an orthographic projection of the second drain electrode portion on the base substrate and the orthographic projection of the gate electrode on the base substrate at least partially overlap.

Non-limitive descriptions are given to the array substrate provided by the embodiments of the present disclosure in the following with reference to a plurality of examples. As described in the following, in case of no conflict, different features in these specific examples may be combined so as to obtain new examples, and the new examples are also fall within the scope of present disclosure.

Figure 3A:
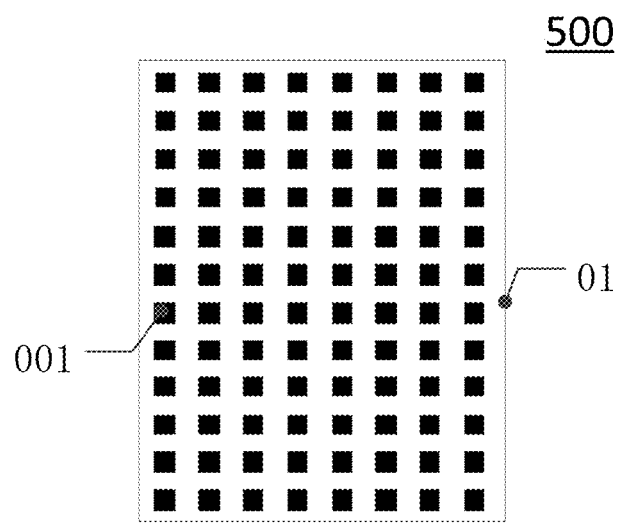
FIG. 3A is a plan view of an array substrate provided by an embodiment of the present disclosure.

FIG. 3A illustrates an array substrate 500. For example, as illustrated in FIG. 3A, the array substrate 500 includes a base substrate 01 and a plurality of pixel units 001 which are arranged in an array and provided on the base substrate 01. It should be understood that, the shape and arrangements of the pixel unit 001 as illustrated in FIG. 3A are only given for example, and the embodiments of the present disclosure are not limited to this case. For example, according to specific implementation demands, the shape of the pixel unit 001 may also be a diamond, and the pixel units 001 may also be arranged according to a delta arrangement.

Figure 4A:
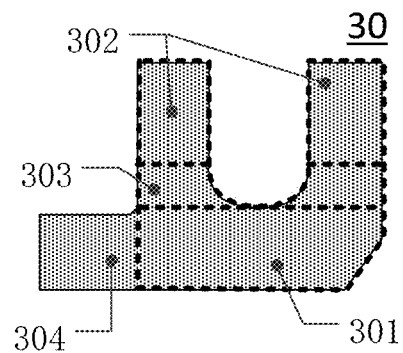
FIG. 4A is a plan view of a drain electrode provided by an embodiment of the present disclosure.
Figure 4B:
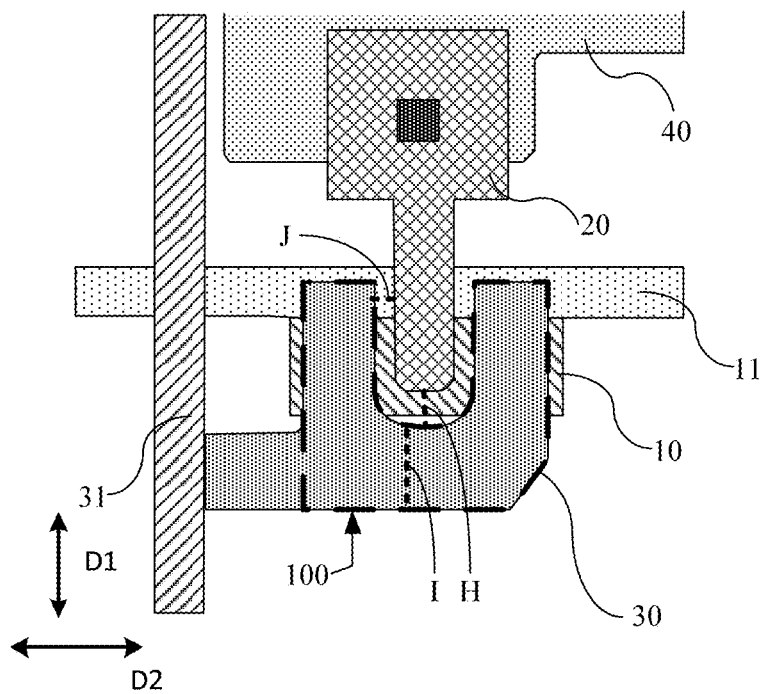
FIG. 4B is another plan view of an array substrate provided by an embodiment of the present disclosure.

For example, as illustrated in FIG. 4B, according to specific implementation demands, the array substrate 500 may further include a gate line 11 and a data line 31, which intersect with each other and are provided on the base substrate 01. For example, the data line 31 extends along a first direction D1, and the gate line 11 extends along a direction that intersects with the first direction D1. The first direction D1, for example, may be perpendicular to the extension direction of the gate line 11 (in this case, the extension direction of the gate line 11 is the second direction), but the embodiments of the present disclosure are not limited to this case.

Figure 3B:
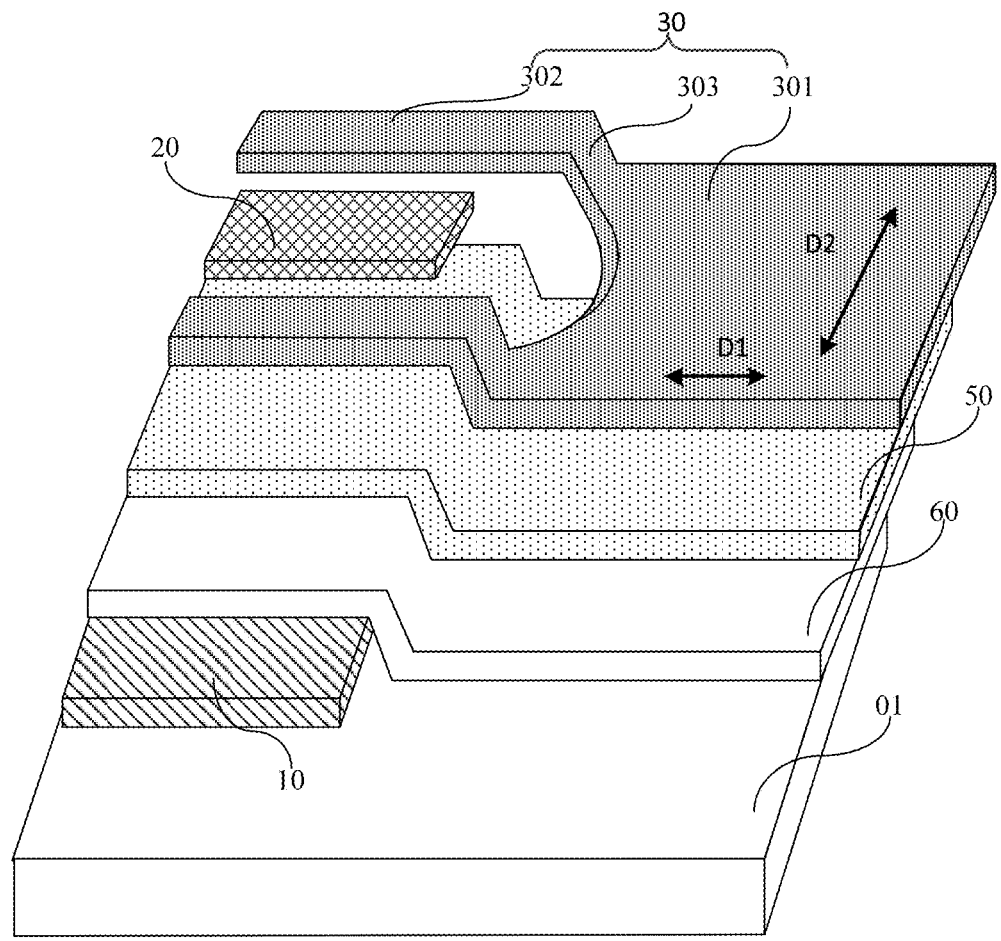
FIG. 3B is a schematically structural view of an array substrate provided by an embodiment of the present disclosure.

For example, as illustrated in FIG. 3B, FIG. 4A and FIG. 4B, each of the pixel units 001 includes a thin-film-transistor. For example, the thin-film-transistor includes a gate electrode 10 and a drain electrode 30. According to actual demands, the thin-film-transistor may further include a source electrode 20 arranged to be spaced apart from the drain electrode 30, a gate insulation layer 60 provided at the side, which is away from the base substrate 01, of the gate electrode 10, and an active layer 50 provided at the side, which is away from the base substrate 01, of the gate insulation layer 60.

For example, as illustrated in FIG. 3B and FIG. 4A, the drain electrode 30 may include a first drain electrode portion 301 (for example, one first drain electrode portion 301), a second drain electrode portion 302 (for example, two second drain electrode portions 302) and a first connection portion 303 (for example, two first connection portions 303). For example, the drain electrode 30 may further include a second connection portion 304 which is used to connect the first drain electrode portion 301 and the data line 31. For example, the first drain electrode portion 301, the second drain electrode portion 302, the first connection portion 303 and the second connection portion 304 may be integrally formed, but the embodiments of the present disclosure are not limited to this case.

For example, as illustrated in FIG. 4A, the extension line of the second drain electrode portion 302 and the first drain electrode portion 301 intersect with each other, and the first connection portion 303 is used to connect the second drain electrode portion 302 and the first drain electrode portion 301 (two first connection portions 303 connect the two second drain electrode portions 302 respectively with two ends of the first drain electrode portion 301). For example, the second drain electrode portion 302 may be in a rectangular shape, the two second drain electrode portions 302 may be parallel to each other, and both the two second drain electrode portions 302 are perpendicular to the first drain electrode portion 301, but the embodiments of the present disclosure are not limited to this case. For example, two edges, which are opposite to each other in the first direction D1, of the first drain electrode portion 301 may be parallel to each other, but the embodiments of the present disclosure are not limited to this case.

For example, as illustrated in FIG. 4A, the width of each of the first connection portions 303 (i.e., the width of the first connection portion 303 along the second direction D2) may be gradually changed along the first direction D1. For example, the width of the end, which is closer to the first drain electrode portion 301, of each of the first connection portions 303 may be larger than the width of the end, which is closer to the second drain electrode portion 302, of each of the first connection portions 303, but the embodiments of the present disclosure are not limited to this case.

Figure 4C:
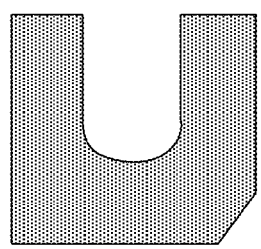
FIG. 4C is a schematic diagram of an orthographic projection of a partially region of a drain electrode provided by an embodiment of the present disclosure.

For example, as illustrated in FIG. 4C, the orthographic projection of the structure (i.e., the structure 100 as illustrated in FIG. 4B) constituted by the first drain electrode portion 301, the two second drain electrode portions 302 and two first connection portions 303, on the base substrate 01 is U-shaped.

For example, as illustrated in FIG. 3B and FIG. 4A, the orthographic projection of the first drain electrode portion 301 on the base substrate 01 and the orthographic projection of the gate electrode 10 on the base substrate 01 are spaced apart, and the orthographic projection of the second drain electrode portion 302 on the base substrate 01 and the orthographic projection of the gate electrode 10 on the base substrate 01 at least partially overlap.

For example, compared with the TFT as illustrated in FIG. 1B and FIG. 2, for the TFT as illustrated in FIG. 3B and FIG. 4B, by allowing the first drain electrode portion 301 and the gate electrode 10 not to overlap in the direction perpendicular to the base substrate 01, the overlapping area between the drain electrode 30 and the gate electrode 10 (and/or the gate line 11) are decreased, and therefore, the parasitic capacitance between the drain electrode 30 and the gate electrode 10 (and/or the gate line 11) is decreased accordingly, that is, the load of the circuit is decreased and the power consumption of the array substrate including the TFT is decreased accordingly.

For example, as illustrated in FIG. 3B, because the first drain electrode portion 301 and the gate electrode 10 do not overlap in the direction perpendicular to the base substrate 01, compared with the surface, which is away from the base substrate 01, of the second drain electrode portion 302, the surface, which is away from the base substrate 01, of the first drain electrode portion 301 is closer to the base substrate 01 in the direction perpendicular to the base substrate 01. For example, according to specific implementation demands, compared with the surface, which is closer to the base substrate 01, of the second drain electrode portion 302, the surface, which is away from the base substrate 01, of the first drain electrode portion 301 is closer to the base substrate 01 in the direction perpendicular to the base substrate 01.

Figure 5:
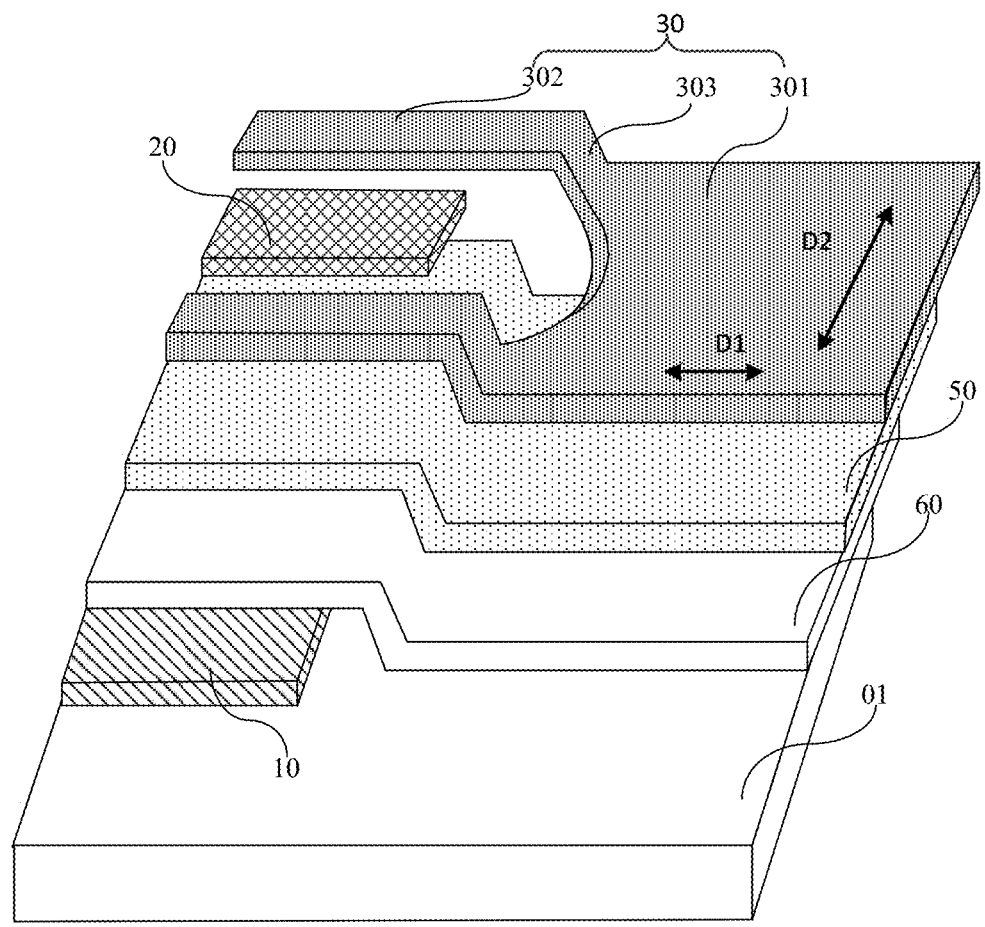
FIG. 5 is a schematically structural view of another array substrate provided by an embodiment of the present disclosure.
Figure 6:
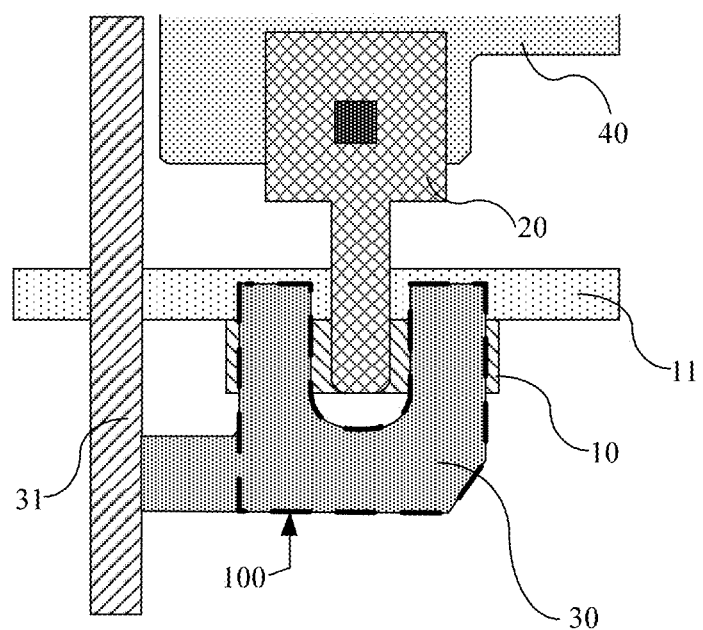
FIG. 6 is a plan view of another array substrate provided by an embodiment of the present disclosure.
Figure 10:
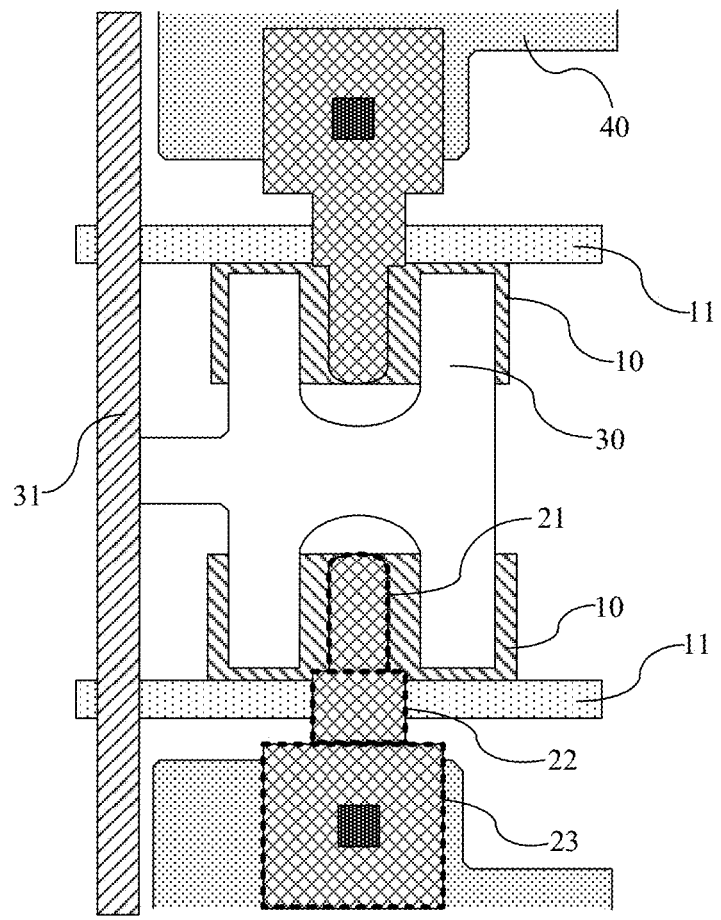
FIG. 10 is a plan view of still another array substrate provided by an embodiment of the present disclosure.

For example, as illustrated in FIG. 5 and FIG. 6, the distance between the orthographic projection of the source electrode 20 (for example, the first source electrode portion 21 as illustrated in FIG. 10) on the base substrate 01 and the orthographic projection of the first drain electrode portion 301 on the base substrate 01 along the first direction D1 is no less than the distance between the orthographic projection of the gate electrode 10 on the base substrate 01 and the orthographic projection of the first drain electrode portion 301 on the base substrate 01 along the first direction D1. In this case, the gate line 11 is not provided in the region between the source electrode 20 and the first drain electrode portion 301, and therefore, the drain electrode 30 and the gate electrode 10 do not overlap in the region. In the case where the length of the source electrode 20 along the first direction D1 is a fixed value, the above-mentioned arrangement allows the size of the gate electrode 10 along the first direction D1 to be further reduced, and the overlapping area between the drain electrode 30 and the gate electrode 10 can be further reduced, and therefore, the parasitic capacitance between the drain electrode 30 and the gate electrode 10 (and the gate line 11) can be further reduced, and thus the power consumption of the array substrate including the TFT can be further reduced.

For example, as illustrated in FIG. 5 and FIG. 6, the distance between the orthographic projection of the source electrode 20 on the base substrate 01 and the orthographic projection of the first drain electrode portion 301 on the base substrate 01 along the first direction D1 may be equal to the distance between the orthographic projection of the gate electrode 10 on the base substrate 01 and the orthographic projection of the first drain electrode portion 301 on the base substrate 01 along the first direction D1. In this case, the width of the channel of the TFT can be maximized without the need to increase the parasitic capacitance ((i.e., the need to increase the power consumption) between the drain electrode 30 and the gate electrode 10 (and the gate line 11), and therefore, the on-state current and the control performance of the TFT can be improved.

Figure 7:
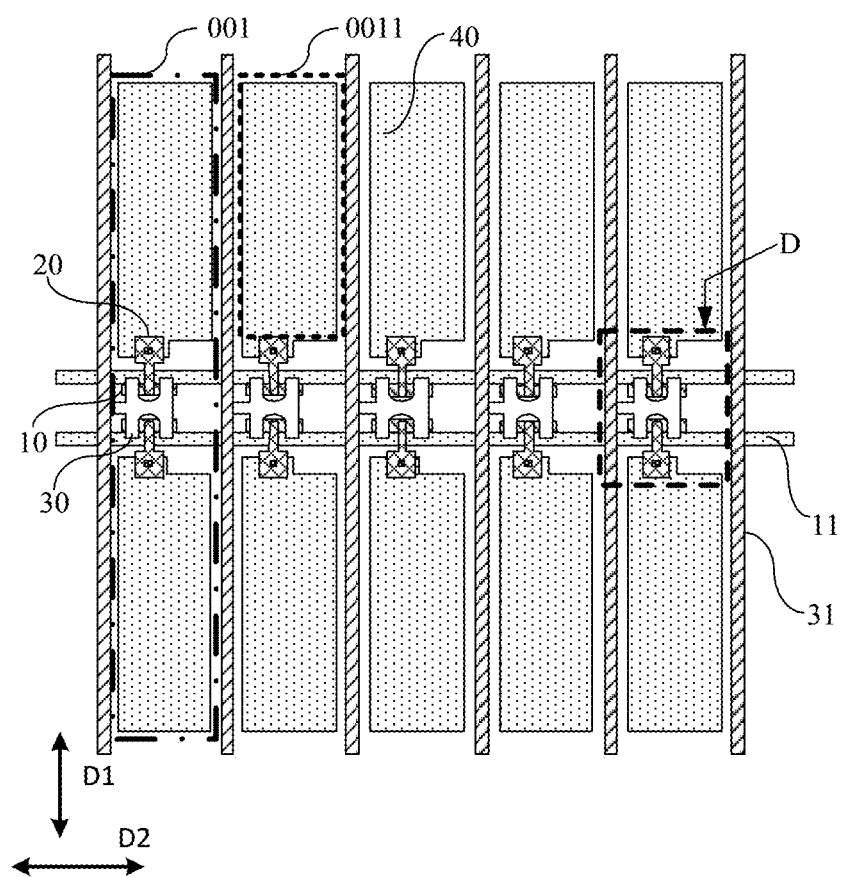
FIG. 7 is a plan view of further another array substrate provided by an embodiment of the present disclosure.

For example, as illustrated in FIG. 7, each of the pixel units 001 may include two sub-pixels 0011 sequentially provided long the first direction D1 and two thin-film-transistors provided between two sub-pixels 0011. For example, two gate lines 11 are provided between two sub-pixels 0011 of each of the pixel units 001; in this case, the width of the region (i.e., the width of the region D along the first direction D1), which needs to be shielded by the black matrix, of the array substrate along the first direction D1 can be decreased, and therefore, the aperture ratio of the array substrate can be increased.

Figure 8:
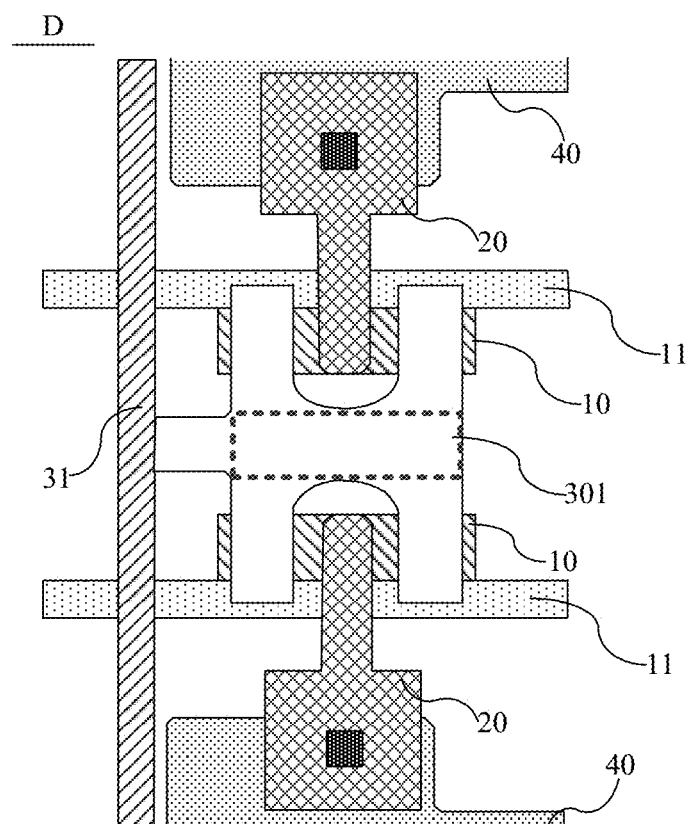
FIG. 8 is an enlarged diagram of region D as illustrated in FIG. 7.

FIG. 8 is an enlarged diagram of the region D in FIG. 7. For example, as illustrated in FIG. 8, two thin-film-transistors in each of the pixel units 001 may share the first drain electrode portion 301, and therefore, the width of the region, which need to be shielded by the black matrix, of the array substrate along the first direction D1 may be further decreased (for example, the decrement may be equal to the width of one first drain electrode portion 301 along the first direction D1), and the aperture ratio of the array substrate can be further increased. In this case, as illustrated in FIG. 7 and FIG. 8, two thin-film-transistors in each of the pixel units 001 may further share the second connection portion 304, and therefore, the structure and the manufacturing process of the TFT can be simplified.

Figure 9:
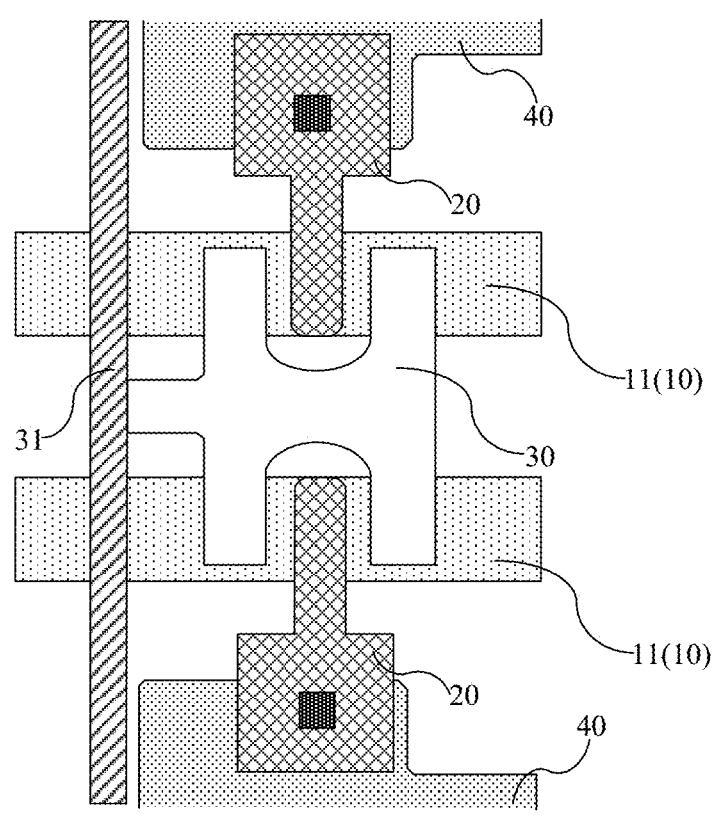
FIG. 9 is a plan view of still another array substrate provided by an embodiment of the present disclosure.

For example, as illustrated in FIG. 9, according to specific implementation demands, at least a part of each of the gate lines 11 may be used as a gate electrode 10 of a corresponding thin-film-transistor (i.e., the thin-film-transistor electrically connected with the gate line 11). That is, in this case, no additional gate electrode need to be formed, and the function of the gate electrode 10 can be realized by at least the part of the gate line 11, and therefore, the structure and the manufacturing process of the TFT can be simplified For example, as illustrated in FIG. 10, each of the pixel units 001 may include a pixel electrode 40 (for example, two pixel electrode 40). For example, the source electrode 20 may include a first source electrode portion 22, a second source electrode portion 22 and a third source electrode portion 23; the second source electrode portion 22 is used to connect the first source electrode portion 21 and the third source electrode portion 23; and the third source electrode portion 23 and the pixel electrode 40 electrically connect with each other (for example, electrically connect with each other through a via-hole).

For example, as illustrated in FIG. 10, the extension direction of each of the second drain electrode portions 302 may be parallel to the extension direction of the first source electrode portion 21; and the extension direction of each of the first drain electrode portions 301 may be perpendicular to the extension direction of first source electrode portion 21, but the embodiments of the present disclosure are not limited to this case.

It should be understood that, the size of the second drain electrode portion in the extension direction of the second drain electrode portion is larger than the size of the second drain electrode portion in the direction perpendicular to the extension direction of the second drain electrode portion, the size of the first drain electrode portion in the extension direction of the first drain electrode portion is larger than the size of the first drain electrode portion in the direction perpendicular to the extension direction of the first drain electrode portion, and the "extension direction" in other place of the embodiments of the present disclosure has a similar meaning, and no further descriptions will be given here.

For example, as illustrated in FIG. 10, the width of the second source electrode portion 22 in the second direction D2 may be larger than the width of the first source electrode portion 21 in the second direction D2; in this case, the distance between the two second drain electrode portions 302 along the second direction D2 can be decreased, and therefore, the size of the region D along the second direction D2 can be decreased, and the aperture ratio of the array substrate can be further increased. Furthermore, the decreasing of the distance between the two second drain electrode portions 302 along the second direction D2 can allow the maximum value of the size of the first connection portion 303 along the second direction D2 to be decreased, and therefore the overlapping area between the drain electrode 30 and the gate electrode 10, and the power consumption of the array substrate can be further decreased provided that other parameters are fixed values.

For example, in the case where the gate electrode 10 is provided at the side, which is closer to the base substrate 01, of the data line 31, the distance between the source electrode 20 and the base substrate 01 are not exactly identical (i.e., the source electrode 20 has a climbing phenomenon). In the case where the size of the second source electrode portion 22 along the second direction D2 is too small, disconnection of the source electrode 20 can be caused; and therefore, by allowing the width of the second source electrode portion 22 in the second direction D2 to be larger than the width of the first source electrode portion 21 in the second direction D2, the risk of the disconnection of the source electrode 20 can be reduced.

For example, as illustrated in FIG. 10, the width of the second source electrode portion 22 in the second direction D2 may be smaller than the width of the third source electrode portion 23 along the second direction D2; in this case, the contacting area of the source electrode 20 and the pixel electrode 40 can be guaranteed. For example, the width of the third source electrode portion 23 along the second direction D2 may be maximized in the case where the size of the TFT and the aperture ratio of the array substrate are not adversely affected.

For example, as illustrated in FIG. 5 and FIG. 6, the distance H, between the orthographic projection of the first source electrode portion 21 (i.e., the source electrode 20) on the base substrate 01 and the orthographic projection of the first drain electrode portion 301 on the base substrate 01, along the first direction D1 may be larger than the distance J, between the orthographic projection of the first source electrode portion 21 on the base substrate 01 and the orthographic projection of the second drain electrode portion 302 on the base substrate 01, along the second direction D2. By increasing the distance H, between the orthographic projection of the first source electrode portion 21 (i.e., the source electrode 20) on the base substrate 01 and the orthographic projection of the first drain electrode portion 301 on the base substrate 01, along the first direction D1, the possibility of the electrical connection, which is caused by the manufacturing error, between the source electrode 20 and the drain electrode 30 can be reduced, and therefore, the yield can be increased.

For example, the distance, between the orthographic projection of the first source electrode portion 21 on the base substrate 01 and the orthographic projection of the first drain electrode portion 301 on the base substrate 01, along the first direction D1 may be equal to 1.1-1.25 times of the distance, between the orthographic projection of the first source electrode portion 21 on the base substrate 01 and the orthographic projection of the second drain electrode portion 302 on the base substrate 01, along the second direction D2, but the embodiments of the present disclosure are not limited to this case.

For example, the distance, between the orthographic projection of the first source electrode portion 21 on the base substrate 01 and the orthographic projection of the second drain electrode portion 302 on the base substrate 01, along the second direction D2 may be in the range of 1 micron –3 microns (for example, 2 microns). For example, in the case where the distance, between the orthographic projection of the first source electrode portion 21 on the base substrate 01 and the orthographic projection of the second drain electrode portion 302 on the base substrate 01, along the second direction D2 is equal to 2 microns, the distance, between the orthographic projection of the first source electrode portion 21 on the base substrate 01 and the orthographic projection of the first drain electrode portion 301 on the base substrate 01, along the first direction D1 may be in the range of 2.2 microns –2.5 microns, but the embodiments of the present disclosure are not limited to this case.

For example, the width I (for example, I may be equal to 4 microns) of the first source electrode portion 21 along the first direction D1 may be far larger than the increment (for example, 0.2 microns-0.5 microns) of the distance H, which is between the orthographic projection of the first source electrode portion 21 on the base substrate 01 and the orthographic projection of the first drain electrode portion 301 on the base substrate 01, along the first direction D1, and therefore, the embodiments of the present disclosure can increase the yield of the array substrate while decreasing the power consumption, by allowing the first drain electrode portion 301 and the gate electrode not to overlap with each other in the direction perpendicular to the base substrate 01. For another example, in the case where the two sub-pixels 0011, which are located in same one pixel unit 001, share the first drain electrode portion 301 (other parameters are fixed values), the embodiments of the present disclosure can further reduce the power consumption, or can improve the yield of the array substrate while the power consumption is unchanged.

Figure 11:
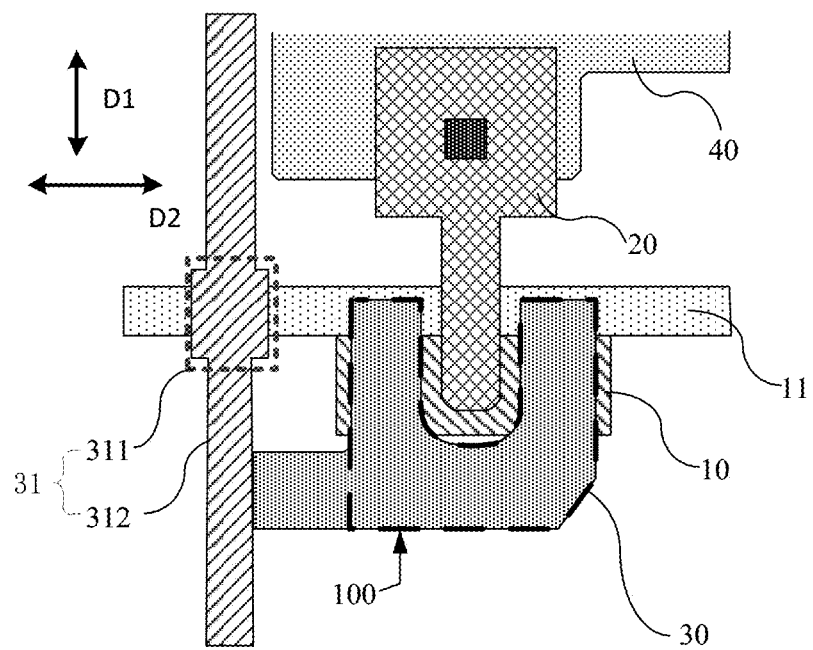
FIG. 11 is a plan view of still another array substrate provided by an embodiment of the present disclosure.
Figure 12:
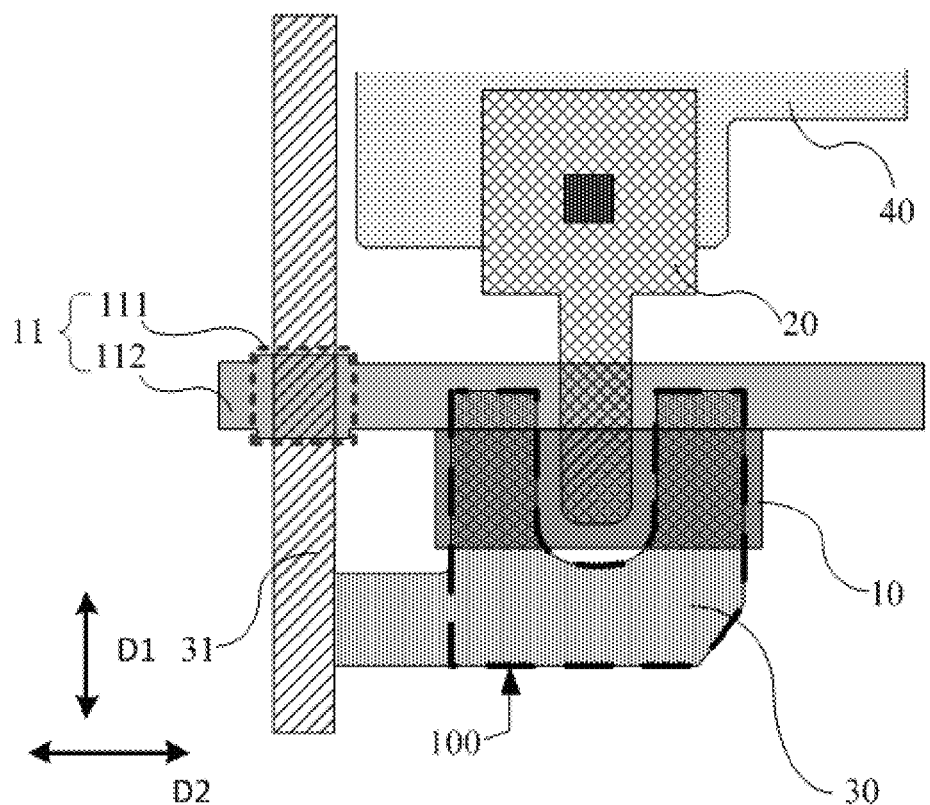
FIG. 12 is a plan view of still another array substrate provided by an embodiment of the present disclosure.
Figure 13:
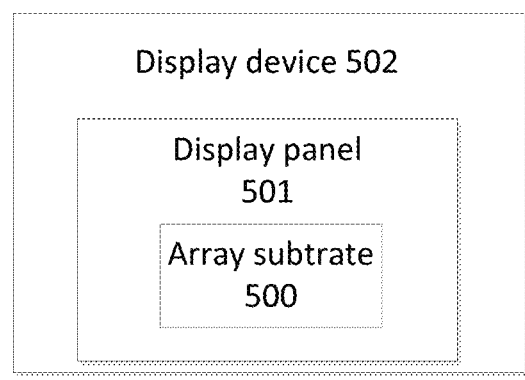
FIG. 13 is an exemplary block diagram of a display panel and a display device provided by an embodiment of the present disclosure.

For example, as illustrated in FIG. 11 and FIG. 12, the array substrate may include a data line 31 and a gate line 11 which intersect with each other. For example, as illustrated in FIG. 12, the gate line 11 may include a first overlapping portion 111 and a first non-overlapping portion 112, the first overlapping portion 111 and the data line 31 overlap with each other in the direction perpendicular to the base substrate 01, and the first non-overlapping portion 112 and the data line 31 do not overlap in the direction perpendicular to the base substrate 01. For example, as illustrated in FIG. 11, the data line 31 may include a second overlapping portion 311 and a second non-overlapping portion 312, the second overlapping portion 311 and the gate line 11 overlap with each other in the direction perpendicular to the base substrate 01, and the second non-overlapping portion 312 and the gate line 11 do not overlap in the direction perpendicular to the base substrate 01.

For example, as illustrated in FIG. 11, in the case where the gate line 11 is provided at the side, which is closer to the base substrate 01, of the data line 31, the width of the second overlapping portion 311 along the direction perpendicular to the extension direction of the data line 31 may be larger than the width of the second non-overlapping portion 312 along the direction perpendicular to the extension direction of the data line 31, and therefore, the possibility of the disconnection of the data line 31 can be decreased. For example, the difference of the width of the second overlapping portion 311 along the direction perpendicular to the extension direction of the data line 31 and the width of the second non-overlapping portion 312 along the direction perpendicular to the extension direction of the data line 31, for example, may be in the range of 0.5 microns-1 micron, but the embodiments of the present disclosure are not limited to this case.

For example, as illustrated in FIG. 12, in the case where the data line 31 is provided at the side, which is closer to the base substrate 01, of the gate line 11, the width of the first overlapping portion 111 in the direction perpendicular to the extension direction of the gate line 11 is larger than the width of the first non-overlapping portion 112 in the direction perpendicular to the extension direction of the gate line 11, and therefore, the possibility of the disconnection of the gate line 11 can be decreased. For example, the difference between the width of the first overlapping portion 111 in the direction perpendicular to the extension direction of the gate line 11 and the width of the first non-overlapping portion 112 in the direction perpendicular to the extension direction of the gate line 11, for example, may be in the range of 0.5 microns-1 micron, but the embodiments of the present disclosure are not limited to this case.

The following statements should be noted:

(1) No specific limitation will be given to the types of the TFTs in the embodiments of the present disclosure, and the TFTs may be amorphous silicon TFTs, metal oxide TFTs, polycrystalline silicon TFTs, organic TFTs, and so on.

(2) In different examples, the gate electrode 10 and the gate line 11 may be provided on the base substrate 01 before forming the source electrode 20, the drain electrode 30 and the data line 31; or, the source electrode 20, the drain electrode 30 and the data line 31 may be provided on the base substrate 01 before forming the gate electrode 10 and the gate line 11.

(3) No specific limitation will be given to the material of the source electrode 20 and the drain electrode 30 in the embodiments of the present disclosure, as long as the source electrode 20 and the drain electrode 30 are conductive. The material of the source electrode 20 and the drain electrode 30, for example, may be a metal material.

An embodiment of present disclosure further provides another array substrate. As illustrated in FIG. 3B and FIG. 4B, the array substrate includes a base substrate 01, a gate line 11, a data line 31 and a TFT which are provided on the base substrate 01, and the drain electrode 30 of the TFT and the data line 31 connect with each other electrically. The drain electrode 30 includes a U-shape portion 100; the bottom of the U-shape portion 100 does not overlap with the gate line 11 and the gate electrode 10 of the TFT; the distance H between the source electrode 20 of the TFT and the bottom of the U-shape portion 100 is in the range of 2.2-2.5 μm.

In this case, compared with the SSM technology, some embodiments of present disclosure allow the distance H between the source electrode 20 and the bottom of the U-shape portion 100 to be increased by only 0.2-0.5 μm, while allowing the width I of the bottom of the U-shape portion 100 as well as the distance J between the source electrode 20 and the straight portion of the U-shape portion 100 to remain unchanged.

On the basis of the above, as illustrated in FIG. 3B, the TFT further includes a gate insulation layer 60 provided on the side, which is away from the base substrate 01, of the gate electrode 10, and an active layer 50 provided on the side, which is away from the base substrate 01, of the gate insulation layer 60. As illustrated in FIG. 4B, the drain electrode 30 further includes a portion used to electrically connect with the data line 31, an end of the portion connects with the data line 31, and another end of the portion connects with the U-shape portion 100. The array substrate further includes a pixel electrode 40 which electrically connects with the source electrode 20.

An embodiment of present disclosure further provides another array substrate, and the array substrate includes the TFT, the gate line 11, and the data line 31. On one hand, by allowing the distance H between the source electrode 20 and the bottom of the U-shape portion 100 (i.e., in the above-mentioned embodiments, the structure formed by the first drain electrode portion 301, the second drain electrode portion 302 and the first connection portion 303, refer to FIG. 6) to be increased by 0.2-0.5 μm, and to be increased up to the range of 2.2-2.5 μm, compared with the SSM technology, the electrical connection between the source electrode 20 and the bottom of the U-shape portion 100 can be avoided. On the other hand, by allowing the bottom of the U-shape portion 100 not to overlap with the gate line 11 and the gate electrode 10 of the TFT, compared with the MSM technology (the bottom of the U-shape portion 100 completely overlap with the gate line 11 and the gate electrode 10), the overlapping area between the bottom of the U-shape portion 100 and the gate electrode 10 and gate line 11 can be reduced to zero; and in this case, even though the area of the drain electrode 30 is increased because the distance H is increased and the width I remains unchanged, and the overlapping area between the straight portion of the U-shape portion 100 and the gate electrode 10 and gate line 11 is increased, but the increase of the overlapping area related to the straight portion of the U-shape portion 100 is far less than the decrease of the overlapping area related to the bottom of the U-shape portion 100. Therefore, compared with the MSM technology, the overall overlapping area between the drain electrode 30 and the gate electrode 10 and gate line 11 is decreased, and the parasitic capacitance between the drain electrode 30 and the gate electrode 10 and gate line 11 is decreased accordingly, and thus the load of the circuit is decreased, the charge-discharge performance of the pixel is improved, and the power consumption is decreased.

For example, as illustrated in FIG. 5 and FIG. 6, the region between the source electrode 20 and the bottom of the U-shape portion 100 do not overlap the gate line 11 and the gate electrode 10.

In an embodiment of present disclosure, by allowing the region between the source electrode 20 and the bottom of the U-shape portion 100 not to overlap the gate line 11 and the gate electrode 10, the overlapping area between the drain electrode 30 and the gate electrode 10 is decreased, and the overlapping area between the drain electrode 30 and the gate line 11 is decreased as well, and the parasitic capacitance between the drain electrode 30 and the gate electrode 10 and gate line 11 is decreased, and therefore, the load of the circuit is decreased, the charge-discharge performance of the pixel is improved, and the power consumption is further decreased.

For example, as illustrated in FIG. 7 and FIG. 8, the gate line 11 in n-th row is provided to be adjacent to the gate line 11 in (n−1)th row; for the TFTs in any column, the U-shape portion 100 of the TFT in the n-th row and the U-shape portion 100 of the TFT in the (n−1)th row share same one bottom, and the shared portion is provided between the gate line 11 in the n-th row and the gate line 11 in the (n−1)th row, in which n is a positive even number.

In an embodiment of present disclosure, because the U-shape portion 100 of the TFT in the n-th row and the U-shape portion 100 of the TFT in the (n−1)th row share same one bottom, the size of the TFT can be decreased, and the aperture ratio of the pixel can be increased.

For example, as illustrated in FIG. 9, a portion of the gate line 11 may serve as the gate electrode 10.

In an embodiment of present disclosure, by allowing the portion of the gate line 11 to serve as the gate electrode 10, the advantage of simplifying the manufacturing process can be realized.

For example, as illustrated in FIG. 10, the source electrode 20 includes a first source electrode portion 21, a second source electrode portion 22, and a third source electrode portion 23, which are sequentially connect with each other. The first source electrode portion 21 is provided to be adjacent to the inner surface of the U-shape portion 100, the width of the second source electrode portion 22 is larger than the width of the first source electrode portion 21, and the width of the second source electrode portion 22 is smaller than the width of the third source electrode portion 23.

In this example, the pixel electrode 40 electrically connects with the third source electrode portion 23 through a via-hole.

It should be understood that, the width of the first source electrode portion 21, the width of the second source electrode portion 22, and the width of the third source electrode portion 23 are set according to specific manufacturing process, and the widths may be changed when a different manufacturing process is adopted.

In an embodiment of present disclosure, the width of the second source electrode portion 22 may be slightly larger than the width of the first source electrode portion 21, and the risk of disconnection of the source electrode 20 can be decreased, which is caused by climbing due to provide the gate electrode 10 and the gate line 11 before providing the source electrode 20. Because the third source electrode portion 23 electrically connects with the pixel electrode 40 through a via-hole, and the size of the via-hole is normally relatively large to guarantee the contacting area between the source electrode 20 and the pixel electrode 40, and therefore, the width of the third source electrode portion 23 may be maximized provided that the size of the TFT and the aperture ratio of the array substrate are not adversely affected.

For example, as illustrated in FIG. 11, when the gate line 11 is provided at the side, which is closer to the base substrate 01, of the data line 31, the width of the gate line 11 is equal to X; the width of the portion, which does not overlap with the orthographic projection of the gate line 11 on the base substrate 01, of the data line 31 is equal to Y; and the width of the portion, which overlaps with the orthographic projection of the gate line 11 on the base substrate 01, of the data line 31 is in the range of (Y+0.5)~(Y+1) μm.

It should be understood that, the width Y of the portion, which does not overlap with the orthographic projection of the gate line 11 on the base substrate 01, of the data line 31 and the width X of the gate line 11 are set according to specific manufacturing process, and the values of X and Y may be changed when a different manufacturing process is adopted.

In an embodiment of present disclosure, when the gate line 11 is provided at the side, which is closer to the base substrate 01, of the data line 31, in the region where the orthographic projection of the data line 31 on the base substrate 01 and the orthographic projection of the gate line 11 on the base substrate 01 overlap with each other, the width of the data line 31 may be increased by 0.5-1 μm, so as to reduce the risk of disconnection of the data line 31, which is caused by providing the gate line 11 before forming the data line 31.

For example, as illustrated in FIG. 12, when the data line 31 is provided at the side, which is closer to the base substrate 01, of the gate line 11, the width of the data line 3 is equal to Y; the width of the portion, which does not overlap with the orthographic projection of the data line 31 on the base substrate 01, of the gate line 11 is equal to X; and the width of the portion, which overlaps with the orthographic projection of the data line 31 on the base substrate 01, of the gate line 11 is in the range of (X+0.5)-(X+1) μm.

It should be understood that the width X of the portion, which does not overlap with the orthographic projection of the data line 31 on the base substrate 01, of the gate line 11 and the width Y of the data line 31 are set according to specific manufacturing process, and the values of X and Y may be changed when a different manufacturing process is adopted.

In an embodiment of present disclosure, when the data line 31 is provided at the side, which is closer to the base substrate 01, of the gate line 11, in the region that the orthographic projection of the gate line 11 on the base substrate 01 and the orthographic projection of the data line 31 on the base substrate 01 overlap with each other, the width of the gate line 11 may be increased by 0.5-1 μm, so as to reduce the risk of disconnection of the gate line 11 which is caused by providing the data line 31 before the gate line 11.

The embodiments of the present disclosure further provide a display panel 501, and the display panel 501 includes the array substrate 500 provided by any one of the embodiments of the present disclosure. For example, the array substrate provided by the embodiments of the present disclosure allows the first drain electrode portion and the gate electrode not to overlap with each other in the direction perpendicular to the base substrate, and the overlapping area between the drain electrode and the gate electrode can be decreased, and the power consumption of the array substrate and the display panel can be decreased.

The embodiments of the present disclosure further provide another display panel, and the display panel includes the array substrate. The array substrate includes a TFT, a gate line 11, and a data line 31. On one hand, by allowing the distance H between the source electrode 20 and the bottom of the U-shape portion 100 to be increased by 0.2-0.5 μm, and to be increased to the range of 2.2-2.5 μm, compared with the SSM technology, the electrical connection between the source electrode 20 and the bottom of the U-shape portion 100 can be avoided. On the other hand, by allowing the bottom of the U-shape portion 100 not to overlap with the gate line 11 and the gate electrode 10 of the TFT, compared with the MSM technology (the bottom of the U-shape portion 100 completely overlaps with the gate line 11 and gate electrode 10), the overlapping area between the bottom of the U-shape portion 100 and the gate electrode 10 and gate line 11 can be reduced to zero, and in this case, even though the area of the drain electrode 30 is increased because the distance H is increased and the width I remains unchanged, and the overlapping area between the straight portion of the U-shape portion 100 and the gate electrode 10 and gate line 11 is increased, but the increase of the overlapping area related to the straight portion of the U-shape portion 100 is far less than the decrease of the overlapping area related to the bottom of the U-shape portion 100. Therefore, compared with the MSM technology, the overall overlapping area between the drain electrode 30 and the gate electrode 10 and gate line 11 is decreased, and the parasitic capacitance between the drain electrode 30 and the gate electrode 10 as well as the gate line 11 is decreased accordingly, and thus the load of the circuit is decreased, the charge-discharge performance of the pixel is improved, and the power consumption is decreased. For example, the display panel may be a liquid crystal display panel or an OLED (Organic Light-Emitting Diode) display panel, but the embodiments of the present disclosure is not limited to these cases.

For example, when the display panel is the liquid crystal display panel, the display panel may include an array substrate, an opposite substrate, and a liquid crystal layer provided between the array substrate and the opposite substrate. The opposite substrate may include a black matrix, a color filter film, and a common electrode. In this case, the color filter film may be provided on the opposite substrate, and may also be provided on the array substrate; the common electrode may be provided on the array substrate, and may also be provided on the opposite substrate, and no specific limitation will be given to the embodiments of the present disclosure.

For example, when the display panel is the OLED display panel, the display panel may include an array substrate and a packaging substrate. The array substrate may include a TFT, and an anode electrically connects with the drain electrode 30 of the TFT, a cathode, and a functional layer with an organic material provided between the anode and the cathode.

The embodiments of the present disclosure further provide a display device 502, which includes the array substrate 500 provided by any one of the above-mentioned embodiments of the present disclosure, or the display panel 501 provided by any one of the above-mentioned embodiments of the present disclosure. The display device may be a liquid crystal display device, and may also be an OLED display device.

For example, in the case where the display device is the liquid crystal display device, in addition to the liquid crystal display panel, the display device further includes a backlight, and the backlight is used to provide light for the liquid crystal display panel. The backlight may be a direct-lit type backlight, and may also a side-lit type backlight. For example, the direct-lit type backlight may include a backplane, a rubber frame, a light source provided on the backplane, a diffuser plate provided on the light source, and an optical film provided at the light-exiting side of the diffuser plate. Furthermore, the direct-lit type backlight may further include a reflector provided between the backplane and the light source, but the embodiments of the present disclosure are not limited to this case. The side-lit type backlight may include a backplane, a rubber frame, a light guide plate provided on the backplane, an optical film provided at the light-exiting side of the light guide plate, and a light source provided at a side of the light guide plate. Furthermore, the side-lit type backlight may further include a reflector provided between the backplane and the light guide plate, but the embodiments of the present disclosure are not limited to this case.

For example, the display device 502 may be any product or device that has display function, such as a cell phone, a tablet computer, a television, a display screen, a laptop, a digital photo frame and a navigator.

It should be noted that other necessary components (for example, a thin-film-transistor control device, an image data encoding/decoding device, a row scan driver, a column scan driver, a clock circuit and so on) of the display panel 501 and the display device 502 may adopt conventional components, this should be understood by those skilled in the art, no further descriptions will be given herein and it should not be construed as a limitation on the embodiments of the present disclosure.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. An array substrate, comprising:
a base substrate, and
a plurality of pixel units which are arranged in an array and provided on the base substrate,
wherein each of the pixel units comprises a thin-film-transistor, and the thin-film-transistor comprises a gate electrode and a drain electrode;
the drain electrode comprises a first drain electrode portion, a second drain electrode portion and a first connection portion;
an extension line of the second drain electrode portion intersects with the first drain electrode portion, and the first connection portion connects the second drain electrode portion and the first drain electrode portion; and
an orthographic projection of the first drain electrode portion on the base substrate and an orthographic projection of the gate electrode on the base substrate are spaced apart, and an orthographic projection of the second drain electrode portion on the base substrate and the orthographic projection of the gate electrode on the base substrate at least partially overlap;
the each of the pixel units comprises two sub-pixels sequentially provided along a first direction and the thin-film-transistor and another thin-film-transistor are provided between the two sub-pixels;
the thin-film-transistor and the another thin-film-transistor in the each of the pixel units share the first drain electrode portion of the thin-film-transistor;
the thin-film-transistor further comprises a source electrode which is arranged to be spaced apart from the drain electrode;
the source electrode comprises a first source electrode portion provided between the two second drain electrode portions of the thin-film-transistor;
a distance, between an orthographic projection of the first source electrode portion on the base substrate and the orthographic projection of the first drain electrode portion on the base substrate, along the first direction is no less than a distance, between the orthographic projection of the gate electrode on the base substrate and the orthographic projection of the first drain electrode portion on the base substrate, along the first direction;
the distance, between the orthographic projection of the first source electrode portion on the base substrate and the orthographic projection of the first drain electrode portion on the base substrate, along the first direction is larger than a distance, between the orthographic projection of the first source electrode portion on the base substrate and the orthographic projection of the second drain electrode portion on the base substrate, along a second direction, which is perpendicular to the first direction;
the distance, between the orthographic projection of the first source electrode portion on the base substrate and the orthographic projection of the first drain electrode portion on the base substrate, along the first direction is equal to the distance, between the orthographic projection of the gate electrode on the base substrate and the orthographic projection of the first drain electrode portion on the base substrate, along the first direction;
the array substrate further comprises gate lines, two of the gate lines comprise a first gate line and a second gate line;
the gate electrode of the thin film transistor protrudes toward the second gate line from the first gate line, and
a gate electrode of the another thin film transistor protrudes toward the first gate line from the second gate line.

2. The array substrate according to claim 1, wherein a surface, which is away from the base substrate, of the first drain electrode portion is closer to the base substrate in a direction perpendicular to the base substrate compared with a surface, which is away from the base substrate, of the second drain electrode portion.

3. The array substrate according to claim 1, wherein the drain electrode further comprises another second drain electrode portion and another first connection portion;
the first connection portion and the another first connection portion connect the second drain electrode portion and the another second drain electrode portion respectively with two ends of the first drain electrode portion; and
an orthographic projection of a structure, formed of the first drain electrode portion, the second drain electrode portion and the another second drain electrode portion, and the first connection portion and the another first connection portion, on the base substrate is U-shaped.

4. The array substrate according to claim 1, further comprising a data line extending along the first direction, wherein the drain electrode further comprises a second connection portion connecting the first drain electrode portion and the data line; and
the thin-film-transistor and the another thin-film-transistor in the each of the pixel units share the second connection portion of the thin-film-transistor.

5. The array substrate according to claim 1, wherein the gate lines extend along a direction intersects with the first direction; and
the two of the gate lines are provided between the two sub-pixels in the each of the pixel units.

6. The array substrate according to claim 1, wherein each of the pixel units further comprises a pixel electrode;
the source electrode further comprises a second source electrode portion and a third source electrode portion;
the second source electrode portion connects the first source electrode portion and the third source electrode portion;
the third source electrode portion and the pixel electrode connect with each other electrically; and
a width of the second source electrode portion along a second direction, which is perpendicular to the first direction, is larger than a width of the first source electrode portion along the second direction, and the width of the second source electrode portion along the second direction is smaller than a width of the third source electrode portion along the second direction.

7. The array substrate according to claim 1, wherein the distance, between the orthographic projection of the first source electrode portion on the base substrate and the orthographic projection of the first drain electrode portion on the base substrate, along the first direction is 1.1-1.25 times of the distance, between the orthographic projection of the first source electrode portion on the base substrate and the orthographic projection of the second drain electrode portion on the base substrate, along the second direction, which is perpendicular to the first direction.

8. The array substrate according to claim 1, wherein the distance, between the orthographic projection of the first source electrode portion on the base substrate and the orthographic projection of the first drain electrode portion on the base substrate, along the first direction is equal to 2.2 microns-2.5 microns.

9. The array substrate according to claim 1, wherein an extension direction of each of the second drain electrode portions is parallel to an extension direction of the first source electrode portion; and
an extension direction of each of the first drain electrode portions is perpendicular to the extension direction of the first source electrode portion.

10. The array substrate according to claim 1, further comprising a data line and a gate line which intersect with each other,
wherein the gate line comprises a first overlapping portion and a first non-overlapping portion, the first overlapping portion and the data line overlap with each other in a direction perpendicular to the base substrate, and the first non-overlapping portion and the data line do not overlap in the direction perpendicular to the base substrate;
the data line comprises a second overlapping portion and a second non-overlapping portion, wherein the second overlapping portion and the gate line overlap with each other in the direction perpendicular to the base substrate, and the second non-overlapping portion and the gate line do not overlap in the direction perpendicular to the base substrate;
in a case where the gate line is provided at a side, which is closer to the base substrate, of the data line, a width of the second overlapping portion in a direction perpendicular to an extension direction of the data line is larger than a width of the second non-overlapping portion in the direction perpendicular to the extension direction of the data line; and
in a case where the data line is provided at a side, which is closer to the base substrate, of the gate line, a width of the first overlapping portion in a direction perpendicular to an extension direction of the gate line is larger than a width of the first non-overlapping portion in the direction perpendicular to the extension direction of the gate line.

11. The array substrate according to claim 10, wherein in the case where the gate line is provided at the side, which is closer to the base substrate, of the data line, a difference between the width of the second overlapping portion in the direction perpendicular to the extension direction of the data line and the width of the second non-overlapping portion in the direction perpendicular to the extension direction of the data line is in a range of 0.5 microns-1 micron; and
in the case where the data line is provided at the side, which is closer to the base substrate, of the gate line, a difference between the width of the first overlapping portion in the direction perpendicular to the extension direction of the gate line and the width of the first non-overlapping portion in the direction perpendicular to the extension direction of the gate line is in a range of 0.5 microns-1 micron.

12. A display panel, comprising the array substrate according to claim 1.

13. The display panel according to claim 12, wherein the display panel is a liquid crystal display panel; or the display panel is an OLED display panel.

14. A display device, comprising the array substrate according to claim 1.

15. A display device, comprising the display panel according to claim 12.

16. An array substrate, comprising:
a base substrate, and
a plurality of pixel units which are arranged in an array and provided on the base substrate,
wherein each of the pixel units comprises a thin-film-transistor, and the thin-film-transistor comprises a gate electrode and a drain electrode;
the drain electrode comprises a first drain electrode portion, a second drain electrode portion and a first connection portion;
an extension line of the second drain electrode portion intersects with the first drain electrode portion, and the first connection portion connects the second drain electrode portion and the first drain electrode portion;
an orthographic projection of the first drain electrode portion on the base substrate and an orthographic projection of the gate electrode on the base substrate are spaced apart, and an orthographic projection of the second drain electrode portion on the base substrate and the orthographic projection of the gate electrode on the base substrate at least partially overlap;
the drain electrode further comprises another second drain electrode portion and another first connection portion;
the first connection portion and the another first connection portion connect the second drain electrode portion and the another second drain electrode portion respectively with two ends of the first drain electrode portion;
an orthographic projection of a structure, formed of the first drain electrode portion, the second drain electrode portion and the another second drain electrode portion, and the first connection portion and the another first connection portion, on the base substrate is U-shaped;
the each of the pixel units comprises two sub-pixels sequentially provided along a first direction and the thin-film-transistor and another thin-film-transistor are provided between the two sub-pixels;
the thin-film-transistor and the another thin-film-transistor in the each of the pixel units share the first drain electrode portion of the thin-film-transistor;
the array substrate further comprises gate lines, the gate lines extend along a direction intersects with the first direction;
two of the gate lines are provided between the two sub-pixels in the each of the pixel units;
the array substrate further comprises a data line extending along the first direction, the drain electrode further comprises a second connection portion connecting the first drain electrode portion and the data line;
the thin-film-transistor and the another thin-film-transistor in the each of the pixel units share the second connection portion of the thin-film-transistor;
an orthographic projection of the second connection portion in the each of the pixel units on the base substrate is between orthographic projections of the two of the gate lines on the base substrate;
the two of the gate lines comprise a first gate line and a second gate line, a gate electrode of the thin-film-transistor protrudes toward the second gate line from the first gate line, and a gate electrode of the another thin-film-transistor protrudes toward the first gate line from the second gate line; and in an extension direction of the data line, an orthographic projection of the first drain electrode portion, which is shared by the thin-film-transistor and the another thin-film-transistor, on the base substrate is between an orthographic projection of the gate electrode, which protrudes toward the second gate line from the first gate line, on the base substrate and an orthographic projection of the gate electrode, which protrudes toward the first gate line from the second gate line, on the base substrate.

17. An array substrate, comprising:

a base substrate, and a plurality of pixel units which are arranged in an array and provided on the base substrate, wherein each of the pixel units comprises a thin-film-transistor, and the thin-film-transistor comprises a gate electrode and a drain electrode;

the drain electrode comprises a first drain electrode portion, a second drain electrode portion and a first connection portion;

an extension line of the second drain electrode portion intersects with the first drain electrode portion, and the first connection portion connects the second drain electrode portion and the first drain electrode portion;

an orthographic projection of the first drain electrode portion on the base substrate and an orthographic projection of the gate electrode on the base substrate are spaced apart, and an orthographic projection of the second drain electrode portion on the base substrate and the orthographic projection of the gate electrode on the base substrate at least partially overlap;

the drain electrode further comprises another second drain electrode portion and another first connection portion;

the first connection portion and the another first connection portion connect the second drain electrode portion and the another second drain electrode portion respectively with two ends of the first drain electrode portion;

an orthographic projection of a structure, formed of the first drain electrode portion, the second drain electrode portion and the another second drain electrode portion, and the first connection portion and the another first connection portion, on the base substrate is U-shaped;

the each of the pixel units comprises two sub-pixels sequentially provided along a first direction and the thin-film-transistor and another thin-film-transistor are provided between the two sub-pixels;

the thin-film-transistor and the another thin-film-transistor in the each of the pixel units share the first drain electrode portion of the thin-film-transistor;

the array substrate further comprises gate lines;

two of the gate lines are provided between the two sub-pixels in the each of the pixel units;

the array substrate further comprises a data line extending along the first direction;

the gate lines extend along a second direction, which is perpendicular to the first direction;

the thin-film-transistor further comprises a source electrode which is arranged to be spaced apart from the drain electrode;

the source electrode comprises a first source electrode portion provided between the two second drain electrode portions of the thin-film-transistor;

the each of the pixel units further comprises a pixel electrode;

the source electrode further comprises a second source electrode portion and a third source electrode portion;

the second source electrode portion connects the first source electrode portion and the third source electrode portion;

the third source electrode portion and the pixel electrode connect with each other electrically;

a width of the second source electrode portion along the second direction is larger than a width of the first source electrode portion along the second direction, and the width of the second source electrode portion along the second direction is smaller than a width of the third source electrode portion along the second direction;

an orthographic projection of the first source electrode portion on the base substrate and an orthographic projection of the gate electrode on the base substrate are at least partially overlapped;

an orthographic projection of the second source electrode portion on the base substrate and an orthographic projection of the gate line on the base substrate are at least partially overlapped;

the distance, between the orthographic projection of the first source electrode portion on the base substrate and the orthographic projection of the first drain electrode portion on the base substrate, along the first direction is equal to the distance, between the orthographic projection of the gate electrode on the base substrate and the orthographic projection of the first drain electrode portion on the base substrate, along the first direction;

the two of the gate lines comprise a first gate line and a second gate line, a gate electrode of the thin-film-transistor protrudes toward the second gate line from the first gate line, and a gate electrode of the another thin-film-transistor protrudes toward the first gate line from the second gate line; and an orthographic projection of the first drain electrode portion, which is shared by the thin-film-transistor and the another thin-film-transistor, on the base substrate is between an orthographic projection of the gate electrode, which protrudes toward the second gate line from the first gate line, on the base substrate and an orthographic projection of the gate electrode, which protrudes toward the first gate line from the second gate line, on the base substrate.

18. The array substrate according to claim 17, wherein the first source electrode portion, the second source electrode portion and the third source electrode portion are sequentially arranged and directly connected along the first direction.

* * * * *